United States Patent [19]
Bernacki

[11] 3,974,382
[45] Aug. 10, 1976

[54] LITHOGRAPHIC MASK ATTRACTION SYSTEM

[75] Inventor: Stephen E. Bernacki, Worcester, Mass.

[73] Assignee: Massachusetts Institute of Technology, Cambridge, Mass.

[22] Filed: Jan. 6, 1975

[21] Appl. No.: 537,299

[52] U.S. Cl................ 250/327; 101/467; 250/320; 250/480; 250/492 A; 355/12
[51] Int. Cl.² .............. G03C 5/16; G03D 13/08; G03G 15/00; G21K 5/00
[58] Field of Search............. 250/320, 492 A, 481, 250/480, 213, 327; 96/36.2; 101/467; 29/625; 355/12

[56] References Cited
UNITED STATES PATENTS

| | | |
|---|---|---|
| 3,685,906 | 8/1972 | Raterman ............................. 355/12 |
| 3,715,156 | 2/1973 | Levy ..................................... 355/12 |
| 3,732,429 | 5/1973 | Braunstein et al.................. 250/213 |
| 3,743,842 | 7/1973 | Smith et al.......................... 250/320 |

Primary Examiner—Alfred E. Smith
Assistant Examiner—T. N. Grigsby
Attorney, Agent, or Firm—Arthur A. Smith, Jr.; Martin M. Santa; Robert Shaw

[57] ABSTRACT

An electrical voltage is connected between a flexible soft-X-ray mask and a substrate causing the mask to make intimate contact and thereby conform to slight irregularities of the surface of the X-ray sensitive polymer on the substrate to minimize the effect of these irregularities during exposure to soft-X-rays.

12 Claims, 1 Drawing Figure

U.S. Patent  Aug. 10, 1976  3,974,382
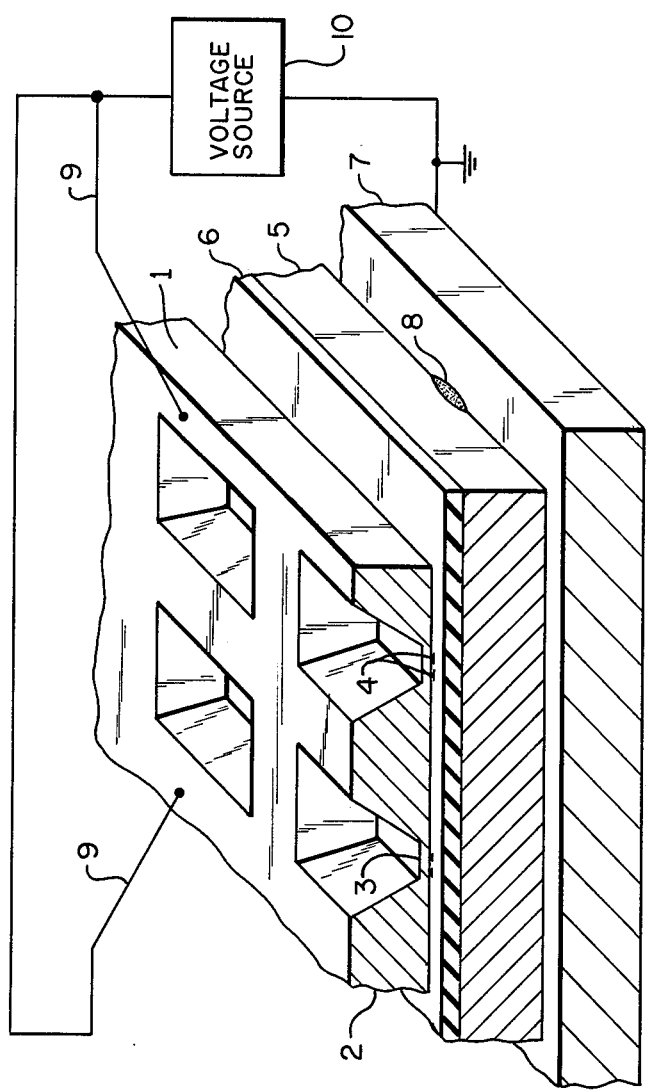

LITHOGRAPHIC MASK ATTRACTION SYSTEM

THE INVENTION

The invention herein described was made in the course of work performed under a contract with the Electronic Systems Division, Air Force Systems Command, United States Air Force.

FIELD OF INVENTION

This invention relates to a lithographic process and more specifically to a method and apparatus for obtaining intimate contact between the mask and the polymer during exposure by soft-X-rays through said mask.

BACKGROUND OF INVENTION

Soft-X-ray printing has been proposed and demonstrated as a technique for replicating sub-micron planer patterns, see Soft-X-ray Lithographic Apparatus and Process, Smith et al, U.S. Pat. No. 3,743,842, July 3, 1973. Soft-X-ray exposure masks can be made from a silicon conducting crystal, see Soft X-ray Mask Support Substrate, Spears et al, U.S. Pat. No. 3,742,230, June 26, 1973. Soft-X-ray exposure masks have been made with diffraction grating patterns consisting of 1800 A wide lines on 3600 A centers and have been successfully replicated. Thus soft-X-ray lithography has shown a resolution capability far greater than that of ordinary photolithography and comparable to the highly sophisticated scanning electron microscope techniques. The simplicity and low cost of X-ray lithography indicates that it would have a significant impact on ultra-high resolution device fabrication in the future.

In the soft-X-ray lithographic process, one replicates patterns having submicron line widths by using a source of soft-X-rays, a mask member having a soft-X-ray transmissive pattern and soft-X-ray absorber patterns of submicron thickness whose absorption of soft-X-rays produces a soft-X-ray image of the mask pattern, and a reproduction member consisting of a substrate and a soft-X-ray sensitive layer supported on said substrate, said sensitive layer being between said substrate and said mask for absorbing soft-X-rays in the pattern created by the mask. However, due to the finite size of the soft-X-ray source, there will be a penumbral blurring of the image of the pattern on the mask, the degree of said penumbra being related directly to the spacing between the pattern on the mask and the X-ray sensitive layer which records the image, i.e., the larger the distance, the larger the penumbral blurring of the image. During exposures in which this blurring must be minimized, then, one has to reduce the distance between the mask and the X-ray sensitive layer to zero, that is, to cause intimate contact.

X-ray masks, while able to be made from a variety of materials, usually consist of thin, X-ray transparent and opaque patterned membranes supported by thicker, self-supporting parts for mechanical strength. The thin X-ray patterned membrane may be silicon, aluminum, beryllium or a polymer material such as Mylar. The structure may be one continuous crystalline material or may be a thin patterned membrane attached to any mechanically suitable support.

Initial attempts to place the X-ray mask membrane in intimate contact with the X-ray sensitive layer were performed by simply applying mechanical pressure to the thick areas of the mask to press it into contact with the X-ray sensitive layer. Experimentally it was found that, while the thick areas were pressed onto the X-ray sensitive layer, the thin, flexible, X-ray transparent membrane would in most cases not come into intimate contact with the X-ray sensitive layer. This is primarily due to two reasons. One is the presence of dust particles which may be in the space between the mask and the sample and will prevent the mask from lying flat in intimate contact with the X-ray sensitive layer. The second reason is that the surface of the X-ray mask and the surface of the substrate supporting the X-ray sensitive layer may not themselves be flat, and even in the complete absence of any dust particles, the mask will rest on the high points of the X-ray sensitive layer with a finite gap existing elsewhere between the mask and other portions of the X-ray sensitive layer.

The fundamental problem is that the mechanical pressure is applied at discrete points on the thick structure of the mask while the pressure actually exerted on the thin, flexible X-ray transparent membrane itself is that produced only through its tensional attachment to the thick structure.

SUMMARY OF INVENTION

It is therefore an object of this invention to provide an attraction system which will bring the thin flexible soft-X-ray transparent membrane into intimate contact with the X-ray sensitive layer regardless of an occasional dust particle or of non-flatness in the surface of the X-ray mask or the surface of the substrate supporting the X-ray sensitive layer. The thin flexible X-ray transparent membrane is usually constructed from an electrically conductive material, such as metal or a semiconductor. If the mask is made of a polymer material, it is made conductive by a thin layer of deposited metal. A mask suitable for use in this invention is described in U.S. Pat. No. 3,742,230, which is incorporated herein by reference.

The substrate is usually a conductor, a semiconductor, or an insulator coated with a thin film of a conductor or a semiconductor. Examples of conducting substrates are metals, and examples of semiconducting substrates are silicon or germanium. An example of an insulating substrate coated with a conductor is lithium niobate with a metal coating, an evaporated aluminum coating, for example, and an example of an insulating substrate coated with a semiconductor is a sapphire substrate with a silicon coating. When any of the above conditions exist, this invention is applicable.

The invention embodies the application of a d.c. or an a.c. electrical potential difference between the soft-X-ray mask and the conductive substrate. The X-ray sensitive layer is an insulator between said mask and said substrate and hence the potential difference will appear across the said soft-X-ray sensitive layer. This causes two sheets of charge of opposite polarity to exist, one on the surface of the silicon mask facing the soft-X-ray sensitive layer and the other sheet of charge on the surface of the conductive substrate facing the soft-X-ray sensitive layer which said substrate supports. These two sheets of electric charge, being of opposite sign, will experience an electrostatic attractive force which will pull the flexible silicon membrane towards the substrate until said membrane comes into intimate contact with the surface of the soft-X-ray sensitive layer supported by the substrate. This electrostatic attraction exerts a uniform and distributed force over the entire area of the soft-X-ray mask including the thin, flexible conductive membrane. This enables the membrane to wrap around the occasional dust particle and to conform to any surface topology which may exist on the substrate and hence on the soft-X-ray sensitive layer.

The buildup of charge due to radiation induced electron hole pairs in an insulator will, in come cases appear in such a way as to neutralize a d.c. electric field impressed across the insulator. In such cases, it is necessary to change the polarity of the electric field with sufficient frequency so as to prevent charge buildup. This can be accomplished with a sine wave, square wave, or any waveform which changes polarity periodically.

DISCLOSURE OF PREFERRED EMBODIMENT

Other objects, features and advantages will occur from the following description of a preferred embodiment and the accompanying drawing in which FIG. 1 is a cross-sectional, schematic, axonometric view of a soft-X-ray mask and sample in the configuration of this invention.

In one specific embodiment, an X-ray mask 1 is constructed of silicon and its thick supporting part 2 consists of a 200 micron thick structure of $0.1 - 0.2$ $\Omega$-cm, n-type, <100> silicon. The thin, flexible, soft-X-ray transparent membrane 3 is 3 microns thick and consists of the same type of silicon as the thick supporting part 2 with the exception that it is doped with boron exceeding a concentration of $2 \times 10^{19}$ boron atoms per cubic centimeter. The construction of such a mask is described in detail in U.S. Pat. No. 3,742,230. The X-ray absorbing patterns 4 consist of 3000 Å thick layers of gold. The substrate 5 is a piece of silicon and it supports a 5000 Å thick layer of an X-ray sensitive polymer 6, for example, polymethyl methacrylate. The method of application of the polymethyl methacrylate to the substrate is the same as that used for photolithography and is well known to those skilled in that art. Specifically, the polymethyl methacrylate is dissolved in a liquid, applied to the substrate, spun to a thin uniform layer, dried and baked. The details of development and subsequent processing can be found in U.S. Pat. No. 3,743,843, incorporated herein by reference. The substrate 5 is grounded to a copper ground block 7 by means of a dab of electrically conducting silver paint 8. The soft-X-ray mask 1 is held in place by two 15 mil diameter tungsten wires 9, which serve as both mechanical supports and as electrical connections, to which a voltage +V can either be 20 volts d.c. or square wave, or 20 volts r.m.s. at 800 Hz which will produce an attractive force per area of approximately $1.6 \times 10^5$ dynes-cm$^{-2}$ which will pull the thin flexible membranes 3 into intimate contact with the top surface of the X-ray sensitive polymer 6.

Although the invention has been described as being used with a soft-x-ray mask, the principle can be applied to any electrically conducting optical mask such as a 10 mil glass mask which is used for conventional photolithography. An electrically conductive, optically transparent film is applied to such a mask to utilize it in this manner.

Having described apparatus and method for attracting the mask to the substrate in a lithographic system, in accordance with the invention, it is believed obvious that other modifications and variations of the invention are possible in the light of the above teachings. It is therefore to be understood that changes may be made in the particular embodiment of the invention described which are within the full intended scope of the invention as described by the appended claims.

What is claimed is:
1. Apparatus for lithography comprising:
an electrically-conductive substrate,
an electrically-insulating, soft-X-ray radiation-sensitive layer on said substrate,
an electrically-conductive mask in physical contact with said layer,
a source of electrical voltage continuously connected between said mask and said substrate to pull said mask into intimate physical contact with said layer,
a source of soft-X-ray radiation to expose said layer through said mask.
2. The apparatus of claim 1 wherein:
said mask has thin flexible regions, and
said electrical voltage is sufficiently large to deflect at least said flexible regions into contact with said radiation-sensitive layer over the entire flexible region because of the electrostatic force between said mask and said substrate.
3. The apparatus of claim 2 wherein:
said voltage is a direct voltage.
4. The apparatus of claim 2 wherein:
said voltage is an alternating voltage.
5. The apparatus of claim 2 wherein:
said voltage is a square wave.
6. The apparatus of claim 1 wherein:
said substrate is a semiconductor.
7. The apparatus of claim 1 wherein:
said substrate is an electrical insulator having an electrically conductive coating on at least one surface.
8. The apparatus of claim 1 wherein:
said mask is a semiconductor.
9. The apparatus of claim 1 wherein:
said mask is an electrical insulator with a layer of metal on at least one face of said mask.
10. The apparatus of claim 1 wherein:
said radiation-sensitive layer is polymethyl methacrylate.
11. A method for lithographic printing comprising:
coating an electrically conductive substrate with a soft-X-ray radiation sensitive electrically-insulating layer,
placing an electrically conductive mask in contact with said layer,
applying a voltage between said substrate and said mask of sufficient magnitude to cause said mask to be electrostatically attracted to said substrate to cause radiation transparent regions of said mask to conform to the surface of said layer,
exposing said layer through said mask to soft-X-ray radiation to change the effective molecular weight of the layer in conformity with the soft X-ray absorption pattern of said mask.
12. The method of claim 11 where said radiation-sensitive layer is polymethyl methacrylate polymer.

* * * * *